United States Patent
Hong

(10) Patent No.: US 8,349,675 B2
(45) Date of Patent: Jan. 8, 2013

(54) METHOD FOR FORMING A GATE ELECTRODE

(75) Inventor: Zhongshan Hong, Shanghai (CN)

(73) Assignee: Semiconductor Manufacturing International Corp., Shanghai (CN)

( * ) Notice: Subject to any disclaimer, the term of this patent is extended or adjusted under 35 U.S.C. 154(b) by 0 days.

(21) Appl. No.: 13/177,517

(22) Filed: Jul. 6, 2011

(65) Prior Publication Data

US 2012/0135594 A1 May 31, 2012

(30) Foreign Application Priority Data

Nov. 30, 2010 (CN) .......................... 2010 1 0568297

(51) Int. Cl.
*H01L 21/338* (2006.01)
(52) U.S. Cl. .... 438/183; 438/705; 438/926; 257/E21.19
(58) Field of Classification Search .................. 438/183, 438/926, 184, 705
See application file for complete search history.

(56) References Cited

U.S. PATENT DOCUMENTS

| 6,326,297 B1* | 12/2001 | Vijayendran | 438/627 |
| 6,664,196 B1* | 12/2003 | Wada et al. | 438/754 |
| 7,557,446 B2* | 7/2009 | Ito et al. | 257/751 |
| 7,595,248 B2* | 9/2009 | Hattendorf et al. | 438/302 |
| 2006/0286729 A1* | 12/2006 | Kavalieros et al. | 438/183 |

FOREIGN PATENT DOCUMENTS

CN 101656205 A 2/2010

\* cited by examiner

*Primary Examiner* — Charles Garber
*Assistant Examiner* — Reema Patel
(74) *Attorney, Agent, or Firm* — Anova Law Group, PLLC

(57) ABSTRACT

A method for forming a gate electrode includes: providing a substrate; forming a gate dielectric layer and forming a sacrificial layer, the sacrificial layer including doping ions, a density of the doping ions in the sacrificial layer decreasing with increasing distance from the substrate; forming a hard mask layer; patterning the sacrificial layer and the hard mask layer; removing part of the patterned sacrificial layer by wet etching with the patterned hard mask layer as a mask, to form a dummy gate electrode which has a top width bigger than a bottom width, and removing the patterned hard mask layer; removing the dummy gate electrode and filling a gate trench with gate material to form a gate electrode which has a top width bigger than a bottom width, which facilitates the filling of the gate material and can avoid or reduce cavity forming in the gate material.

13 Claims, 3 Drawing Sheets

METHOD FOR FORMING A GATE ELECTRODE

CROSS-REFERENCES TO RELATED APPLICATIONS

The present application claims the priority of Chinese Patent Application No. 201010568297.3, entitled "Method for Forming a Gate Electrode", and filed on Nov. 30, 2010, the entire disclosure of which is incorporated herein by reference.

BACKGROUND OF THE INVENTION

1. Field of the Invention

The present invention relates to the semiconductor field, and particularly relates to a method for forming a gate electrode.

2. Description of Prior Art

In conventional technology, processes for forming gate electrode can be divided into processes for gate-first and processes for gate-last. A process for gate-first includes steps: firstly, depositing a gate dielectric layer; forming a gate electrode on the gate dielectric layer; then performing ion implantation to form source and drain; and perform annealing to activate ions in the source and drain. The process for gate-first is simple, but the gate electrode inevitably suffers from high temperature which causes a drift of the threshold voltage Vt of the MOS transistor and affects the performance of the MOS transistor. A process for gate-last includes steps: after annealing, which is after the step of high temperature, etching a polysilicon dummy gate to form dummy gate trench; then filling the dummy gate trench to form gate electrode with proper metal material. Such process for gate-last prevents the gate electrode from high temperature, which avoids the drift of the threshold voltage Vt of the MOS transistor.

The process for gate-last, which allows a wide range of material for the gate electrode, is complicated. With the continued scaling-down of semiconductor device dimensions, during forming the metal gate electrode, the filling efficiency of metal material can not achieve 100% because of the decreased width of the dummy gate trench, especially in processes of 32 nm and below. That is to say there are holes in the metal material filling the dummy gate trench, which increase the parasitic resistance of the gate electrode and decrease the reliability of the MOS transistor.

A conventional method for forming a metal gate includes: providing a substrate; forming a dummy gate electrode structure on the semiconductor substrate, the dummy gate electrode structure including polysilicon; removing the dummy gate electrode structure to provide a trench with a top and a bottom, the top and the bottom having a first width; increasing the width of the top, the top having a second width; and forming a gate electrode in the trench, which includes a step of depositing a first metal in the trench. Such method for forming a gate electrode includes a step of increasing the width of the top of the trench after removing the dummy gate electrode structure, which facilitates the filling of metal into the trench, thus improving the filling efficiency of metal material. However, the Argon sputtering process which is used in the method to increase the width of the top of the trench tends to cause damage to the substrate.

BRIEF SUMMARY OF THE INVENTION

The present invention is to solve the problem that conventional processes for forming a gate electrode tend to cause damage to the substrate.

From the first aspect of the present invention, a method for forming a gate electrode is provided, which includes: providing a substrate; forming a gate dielectric layer on a surface of the substrate and forming a sacrificial layer on a surface of the gate dielectric layer, the sacrificial layer including doping ions, a density of the doping ions in the sacrificial layer decreasing with increasing distance from the substrate; forming a hard mask layer on a surface of the sacrificial layer; patterning the sacrificial layer and the hard mask layer; removing part of the patterned sacrificial layer by wet etching with the patterned hard mask layer as a mask, to form a dummy gate electrode which has a top width bigger than a bottom width, and removing the patterned hard mask layer; forming a dielectric layer covering the gate dielectric layer, an upper surface of the dielectric layer and an upper surface of the dummy gate electrode being on a substantially same level; removing the dummy gate electrode to form a gate trench which has a top width bigger than a bottom width; and filling the gate trench with gate material to form a gate electrode.

Optionally, the sacrificial layer is a tungsten nitride layer, a density of nitrogen in the tungsten nitride layer decreasing with increasing distance from the substrate; and the dummy gate electrode is a tungsten nitride dummy gate electrode.

Optionally, a sidewall of the tungsten nitride dummy gate electrode and a bottom of the tungsten nitride dummy gate electrode form an angle of 91°~105°.

Optionally, the tungsten nitride layer is formed on the gate dielectric layer by chemical vapor deposition; the chemical vapor deposition uses gases including $WF_6$, $H_2$ and $N_2$; and a flow of $N_2$ in a reaction initial stage (initial stage of the reaction) is bigger than a flow of $N_2$ in a reaction end stage (end stage of the reaction).

Optionally, a flow of $WF_6$ is 3~10 sccm, a flow of $N_2$ is 50~200 sccm and a flow of $H_2$ is 100~1000 sccm.

Optionally, the flow of $N_2$ gradually decreases.

Optionally, a reaction time of the chemical vapor deposition is 5~15 seconds.

Optionally, the wet etching is performed with a solution which is $H_2SO_4$ solution, $NH_4OH$ solution or HF solution.

Optionally, the tungsten nitride dummy gate electrode is removed by dry etching.

Optionally, the dry etching is performed with gases including $Cl_2$, HBr and $SF_6$.

Optionally, the gate dielectric layer includes a silicon dioxide layer, a silicon oxynitride layer or a silicon nitride layer, or any combination thereof.

Optionally, the gate dielectric layer further includes at least one high-k dielectric layer with a k higher than 4.5.

Optionally, the method further includes: forming a spacer surrounding the tungsten nitride dummy gate electrode after removing the patterned hard mask layer and before forming the dielectric layer.

In comparison with conventional technologies, embodiments of the present invention can have one or more of the following advantages:

In some embodiments of the present invention, the sacrificial layer includes doping ions, and a density of the doping ions decreases with increasing distance from the substrate. When the sacrificial layer is etched by wet etching, wet etching speed increases with increasing density of doping ions, therefore, a dummy gate electrode is formed which has a top width bigger than a bottom width. After removing the dummy gate electrode, a gate trench is formed which has a top width bigger than a bottom width, which facilitates the filling of the gate material and can avoid or reduce cavity forming in the gate material. Therefore, the method according to some embodiments can prevent damaging the substrate caused by conventional processes.

In some embodiments of the present invention, the sacrificial layer is a tungsten nitride layer, and a density of nitrogen in the tungsten nitride layer decreases with increasing distance from the substrate. When the tungsten nitride layer is etched by wet etching, wet etching speed increases with increasing density of nitrogen in the tungsten nitride layer, and the patterned tungsten nitride layer is formed on the substrate. When removing part of the patterned tungsten nitride layer by wet etching, a tungsten nitride dummy gate electrode which has a top width bigger than a bottom width is formed, because the etching speed at the bottom of the tungsten nitride layer is bigger than that at the top. After forming a dielectric layer and removing the tungsten nitride dummy gate electrode, a gate trench which has a top width bigger than a bottom width is formed. A gate electrode is formed by filling gate material into the gate trench. The method is a simple process. The gate trench, which has a top width bigger than a bottom width, facilitates the filling of the gate material and avoids forming holes or reduces the holes. The method also prevents the damage to the substrate caused by conventional processes.

DETAILED DESCRIPTION OF THE INVENTION

Figure 1:
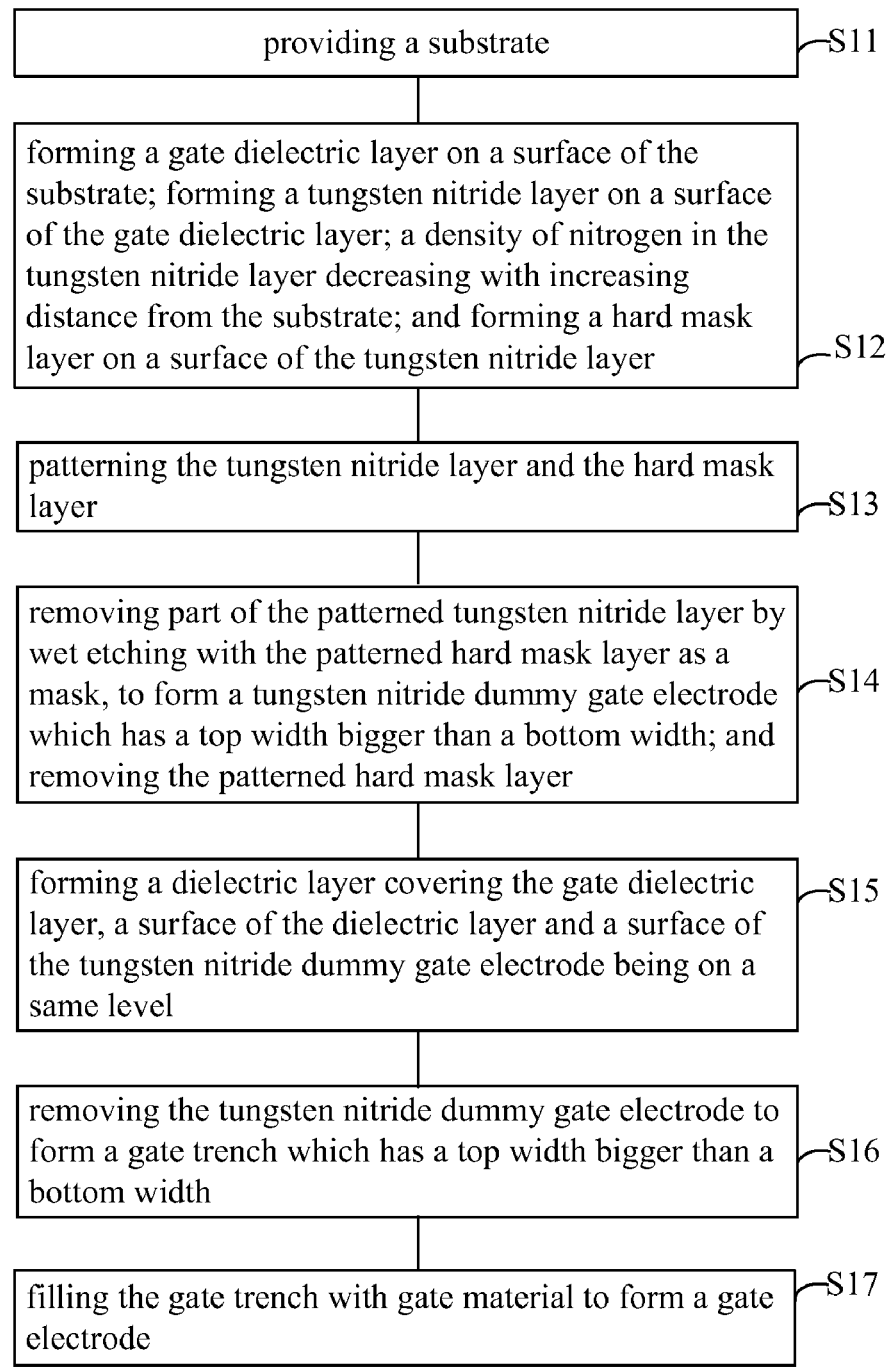
FIG. 1 is a flow diagram of a method for a gate electrode provided in an embodiment of the present invention.

A method for forming a gate electrode is provided in embodiments of the present invention. In the method, the sacrificial layer includes doping ions, and a density of the doping ions decreases with increasing distance from the substrate. When the sacrificial layer is etched by wet etching, wet etching speed increases with increasing density of doping ions, therefore, a dummy gate electrode is formed which has a top width bigger than a bottom width. After removing the dummy gate electrode, a gate trench is formed which has a top width bigger than a bottom width, which facilitates the filling of the gate material and avoids forming holes or reduces the holes. Therefore, the method prevents damaging the substrate caused by conventional processes.

The method for forming a gate electrode includes:
providing a substrate;
forming a gate dielectric layer on a surface of the substrate and forming a sacrificial layer on a surface of the gate dielectric layer, the sacrificial layer including doping ions, a density of the doping ions in the sacrificial layer decreasing with increasing distance from the substrate;
forming a hard mask layer on a surface of the sacrificial layer;
patterning the sacrificial layer and the hard mask layer;
removing part of the patterned sacrificial layer by wet etching with the patterned hard mask layer as a mask, to form a dummy gate electrode which has a top width bigger than a bottom width, and removing the patterned hard mask layer;
forming a dielectric layer covering the gate dielectric layer, an upper surface of the dielectric layer and an upper surface of the dummy gate electrode being on a substantially same level;
removing the dummy gate electrode to form a gate trench which has a top width bigger than a bottom width; and filling the gate trench with gate material to form a gate electrode.

Some embodiments of the invention provide a simple method for forming a gate trench which has a top width bigger than a bottom width. The gate trench facilitates the filling of the gate material and avoids forming holes or reduces the holes. The method prevents damaging the substrate caused by conventional processes. The method makes use of the property that when wet etching the tungsten nitride, the etching speed increases with increasing density of nitrogen in the tungsten nitride. The inventor of this disclosure further discovers that besides tungsten nitride, the material of the sacrificial layer can also be polysilicon, amorphous silicon, epitaxial silicon, polycrystalline germanium, amorphous germanium, epitaxial germanium, or silicon germanium. Doping ions can be phosphorus, boron, arsenic, germanium or silicon, or any combination thereof. When wet etching the sacrificial layer, the etching speed increases with increasing density of doping ions in the sacrificial layer.

In some embodiments of the present invention, the sacrificial layer is a tungsten nitride layer. A density of nitrogen in the tungsten nitride layer decreases with increasing distance from the substrate. When the tungsten nitride layer is etched by wet etching, wet etching speed increases with increasing density of nitrogen in the tungsten nitride layer, and the patterned tungsten nitride layer is formed on the substrate. When removing part of the patterned tungsten nitride layer by wet etching, a tungsten nitride dummy gate electrode which has a top width bigger than a bottom width is formed, because the etching speed at the bottom of the tungsten nitride layer is bigger than that at the top. After forming a dielectric layer and removing the tungsten nitride dummy gate electrode, a gate trench which has a top width bigger than a bottom width is formed. A gate electrode is formed by filling gate material into the gate trench. The method is a simple process. The gate trench, which has a top width bigger than a bottom width, facilitates the filling of the gate material and avoids forming holes or reduces the holes. The method also prevents the damage to the substrate caused by conventional processes.

Hereunder, embodiments of the present invention will be described in detail with reference to the accompanying drawings.

FIG. 1 is a flow diagram of the method for a gate electrode provided in an embodiment of the present invention. Referring to FIG. 1, the method for forming a gate electrode includes:

S11, providing a substrate;

S12, forming a gate dielectric layer on a surface of the substrate; forming a tungsten nitride layer on a surface of the gate dielectric layer; a density of nitrogen in the tungsten nitride layer decreasing with increasing distance from the substrate; and forming a hard mask layer on a surface of the tungsten nitride layer;

S13, patterning the tungsten nitride layer and the hard mask layer;

S14, removing part of the patterned tungsten nitride layer by wet etching with the patterned hard mask layer as a mask, to form a tungsten nitride dummy gate electrode which has a top width bigger than a bottom width; and removing the patterned hard mask layer;

S15, forming a dielectric layer covering the gate dielectric layer, an upper surface of the dielectric layer and an upper surface of the tungsten nitride dummy gate electrode being on a substantially same level;

S16, removing the tungsten nitride dummy gate electrode to form a gate trench which has a top width bigger than a bottom width;

S17, filling the gate trench with gate material to form a gate electrode.

FIG. 2a~FIG. 2h are schematical views of a gate electrode manufactured with the method in FIG. 1.

Figure 2A:
FIG. 2a~FIG. 2h are schematical views of a gate electrode manufactured with the method in FIG. 1.

Referring to FIG. 1 and FIG. 2a, in step S11, a substrate 20 is provided. In embodiments of the present invention, the substrate 20 can be monocrystalline silicon, monocrystalline germanium or monocrystalline silicon-germanium; the substrate can also be SOI; or the substrate can include other materials, such as compounds of the III-V family like gallium arsenide. There is formed a device structure (not shown) on the semiconductor substrate 20, such as an isolation groove structure.

Figure 2B:
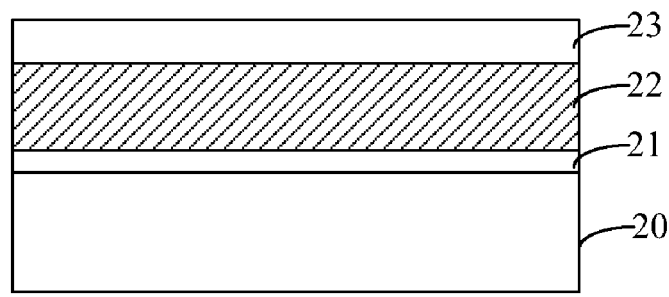

Referring to FIG. 1 and FIG. 2b, in step S12, a gate dielectric layer 21 is formed on a surface of the substrate 20, a tungsten nitride (WN) layer 22 is formed on a surface of the gate dielectric layer 21, and a hard mask layer 23 is formed on a surface of the tungsten nitride layer 22. The density of nitrogen in the tungsten nitride layer decreases with increasing distance from the substrate 20.

In embodiments of the present invention, the material of the gate dielectric layer 21 can be $SiO_2$, SiON or SiN, or any combination thereof. It means that the gate dielectric layer 21 can be a silicon dioxide layer, a silicon oxynitride layer or a silicon nitride layer, or any combination thereof. The gate dielectric layer 21 can be single-layer structure or multiple-layer structure. If the gate dielectric layer 21 is a multiple-layer structure, it can be a two-layer structure consisting of a silicon dioxide layer and a silicon nitride layer, or a three-layer structure consisting of a silicon dioxide layer, a silicon oxynitride layer and a silicon nitride layer. In embodiments of the present invention, the gate dielectric layer 21 can further include at least one high-k dielectric layer with a k higher than 4.5. The material of the high-k dielectric layer is $HfO_2$, HfSiO, HfON, HfSiON, $La_2O_3$, $ZrO_2$, ZrSiO, $TiO_2$ or $Y_2O_3$. For example, the gate dielectric layer 21 is a two-layer structure consisting of a silicon dioxide layer and an HfSiO layer overlying the silicon dioxide layer.

In embodiments of the present invention, the tungsten nitride layer 22 is formed on the gate dielectric layer 21 by chemical vapor deposition. The chemical vapor deposition uses gases including $WF_6$, $H_2$ and $N_2$, and the reaction formula is $WF_6+H_2+N_2 \rightarrow WN+HF$. The flow of $WF_6$ is 3~10 sccm, and the flow of $N_2$ is 50~200 sccm. The flow of $N_2$ in a reaction initial stage is bigger than the flow of $N_2$ in a reaction end stage. The flow of $N_2$ gradually decreases, and changes linearly with respect to time.

The flow of $H_2$ is 100~1000 sccm. In some embodiments of the present application, the gases further includes Ar, which has a flow of 300~1000 sccm. The reaction cavity has an air pressure of 3~5 Torr, a radio frequency power of 200~500 W, and a temperature of 400~500° C. (Celsius degree); the reaction time of the chemical vapor deposition is 5~15 seconds.

In an embodiment, the hard mask layer 23 is silicon nitride.

Figure 2C:
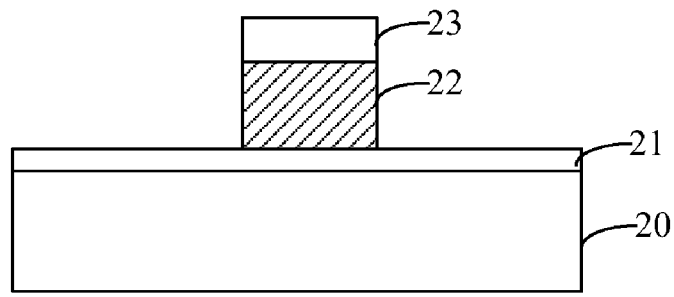

Referring to FIG. 1 and FIG. 2c, in step S13, the tungsten nitride layer 22 and the hard mask layer 23 is patterned. In specific, a photoresist layer is formed on the hard mask layer 23. The method for forming the photoresist layer can be spin-coating method, drop-coating method or brush-coating method. In this embodiment, the photoresist layer is formed by spin-coating method. The photoresist layer is then exposed and developed, which forms a patterned photoresist layer; then, the hard mask layer 23 and the tungsten nitride layer 22 is etched with the patterned photoresist layer as an etching mask, thus the pattern of the patterned photoresist layer is now on the hard mask layer 23 and the tungsten nitride layer 22. In this step, the gate dielectric layer 21 is not etched. The gate dielectric layer 21 is used to protect the substrate 20 from damaging during the following wet etching upon the tungsten nitride.

Figure 2D:
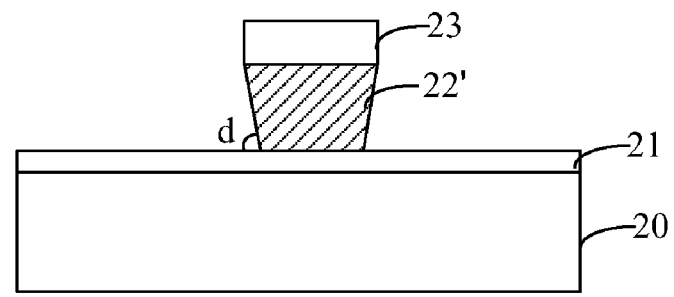

Referring to FIG. 1 and FIG. 2d, in step S14, part of the patterned tungsten nitride layer 22 is removed by wet etching, with the patterned hard mask layer 23 as a mask (also refer to FIG. 2c), to form a tungsten nitride dummy gate electrode 22'. The tungsten nitride dummy gate electrode has a top width bigger than a bottom width. The patterned hard mask layer is then removed. In embodiments of the present invention, the wet etching is performed with $H_2SO_4$ solution, $NH_4OH$ solution, or HF solution. In this embodiment, the tungsten nitride layer 22 is wet etched with $NH_4OH$ solution to form the tungsten nitride dummy gate electrode 22' which has a top width bigger than a bottom width. During the wet etching on the tungsten nitride layer 22, wet etching speed increases with increasing density of nitrogen in the tungsten nitride layer 22. The density of nitrogen in the tungsten nitride layer 22 decreases with increasing distance from the substrate. When removing part of the patterned tungsten nitride layer by wet etching, the tungsten nitride dummy gate electrode 22' which has a top width bigger than a bottom width is formed, because the etching speed at the bottom of the tungsten nitride layer is bigger than that at the top. A sidewall of the tungsten nitride dummy gate electrode 22' and the substrate 20 form an angle d, which is from 75°~89°, which means that the sidewall of the tungsten nitride dummy gate electrode and the bottom of the tungsten nitride dummy gate electrode form an angle of 91°~105°.

Figure 2E:
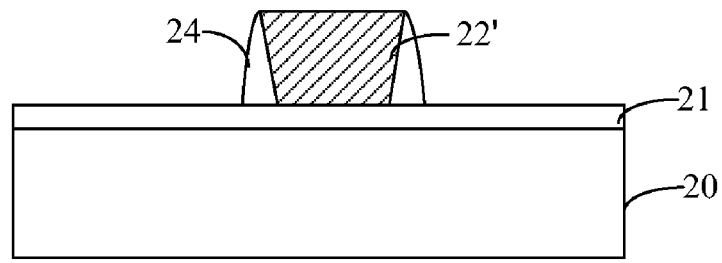

Referring to FIG. 2e, after forming the tungsten nitride dummy gate electrode 22', an ion implantation is performed on the substrate 20 to form the source and the drain (now shown) in the substrate 20. The hard mask layer is then removed. A dielectric layer is formed covering the gate dielectric layer 21 and the tungsten nitride dummy gate electrode 22'. The dielectric layer is then etched to form a spacer 24 surrounding tungsten nitride dummy gate electrode 22'.

Figure 2F:
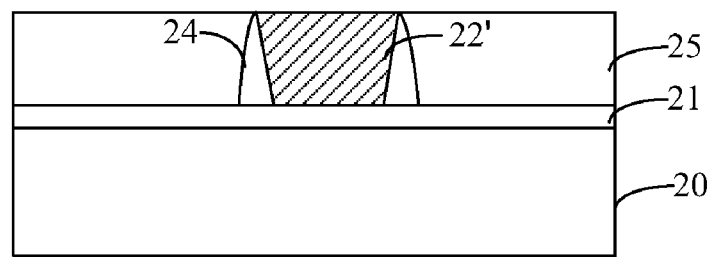

Referring to FIG. 1 and FIG. 2f, in step S15, a dielectric layer 25 is formed, which covers the gate dielectric layer 21. An upper surface of the dielectric layer 25 and an upper surface of the tungsten nitride dummy gate electrode 22' are on a substantially same level. In specific, the dielectric layer 25 is formed covering the gate dielectric layer 21, the spacer 24 and the tungsten nitride dummy gate electrode 22'. Then, part of the dielectric layer 25, which is higher than the level of the upper surface of the tungsten nitride dummy gate electrode 22', is removed by chemical mechanical planarization (CMP). Therefore, the upper surface of the dielectric layer 25 and the upper surface of the tungsten nitride dummy gate electrode 22' are on a substantially same level. In embodiments of the present invention, the material of dielectric layer 25 is low-k material, such as $SiO_2$, SiOF, SiCO and other types of low-k materials. In this embodiment, the dielectric layer 25 is $SiO_2$.

Figure 2G:
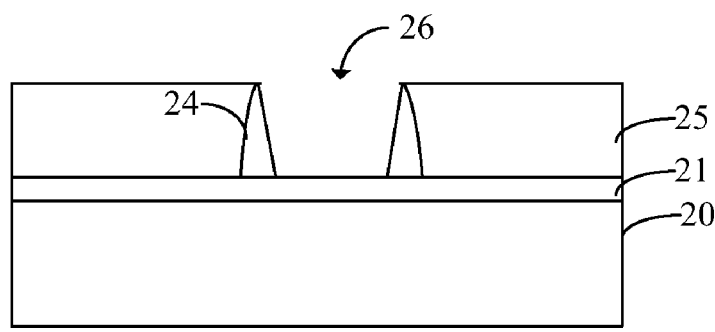

Referring to FIG. 1 and FIG. 2g, in step S16, the tungsten nitride dummy gate electrode 22' is removed (also refer to FIG. 2f), to form a gate trench 26. Because the tungsten nitride dummy gate electrode 22' has the top width bigger than the bottom width, the gate trench 26 has a top width bigger than a bottom width. A sidewall and a bottom of gate trench 26 form an angle of 91°~105°. The tungsten nitride dummy gate electrode is removed by dry etching. In embodiments of the present invention, the dry etching uses gases including $Cl_2$, HBr, and $SF_6$.

Figure 2H:
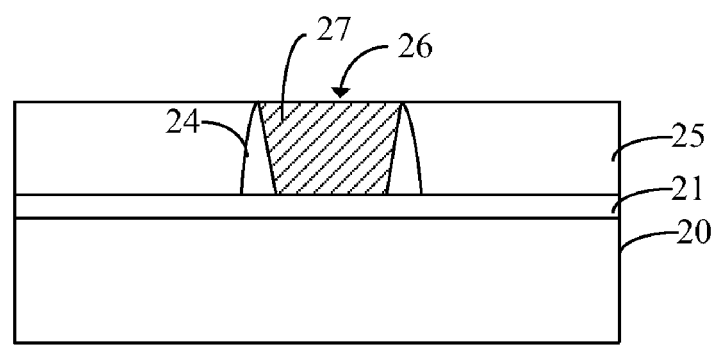

Referring to FIG. 1 and FIG. 2h, in step S17, a gate electrode 27 is formed by filling the gate trench 26 with gate material. The method for forming the gate electrode 27 includes: filling the gate trench 26 with gate material by vapor deposition, such as physical vapor deposition (PVD) and chemical vapor deposition (CVD); after filling up the gate trench 26, performing a planarization process upon the gate material, such as chemical mechanical planarization (CMP), to form a gate electrode 27. In this embodiment, the game material is aluminum. The aluminum is filled into the gate trench 26 by physical vapor deposition. During depositing the aluminum, aluminum is also deposited on the upper surface of the dielectric layer 25. Then a planarization process is performed to remove the aluminum overlying the dielectric layer 25, to form the gate electrode 27; the upper surface of the gate electrode 27 and the upper surface of the dielectric layer 25 are on the substantially same level.

Although tungsten nitride is used as a sacrificial layer to describe the method for forming a gate electrode in the above embodiments, tungsten nitride is not the only material for the sacrificial layer. The material of the sacrificial layer can also be polysilicon, amorphous silicon, epitaxial silicon, polycrystalline germanium, amorphous germanium, epitaxial germanium, or silicon germanium. Doping ions can be phosphorus, boron, arsenic, germanium or silicon, or any combination thereof. When wet etching the sacrificial layer, the etching speed increases with increasing density of doping ions in the sacrificial layer. The wet etching is performed with a solution, which can be select from the group consisting of mixed solution of hydrofluoric acid and nitric acid, hydrofluoric acid solution, potassium hydroxide solution, tetramethylammonium hydroxide (TMAH) solution, hydrogen peroxide, mixed solution of hydrogen chloride and hydrogen peroxide, and mixed solution of ammonia water and hydrogen peroxide. It should be noted that solution concentration should be selected properly to form a dummy gate electrode which has a top width bigger than a bottom width. For example, in some embodiments, the doping ions are phosphorus ions; the sacrificial layer is etched with a mixture of hydrofluoric acid and nitric acid, with a mix proportion of 5:1; and the etching time is 10~100 seconds.

Although the present invention has been illustrated and described with reference to the preferred embodiments of the present invention, those ordinary skilled in the art shall appreciate that various modifications in form and detail may be made without departing from the spirit and scope of the invention.

What is claimed is:

1. A method for forming a gate electrode, comprising:
providing a substrate;
forming a gate dielectric layer on a surface of the substrate and forming a sacrificial layer on a surface of the gate dielectric layer, the sacrificial layer including doping ions, a density of the doping ions in the sacrificial layer decreasing with increasing distance from the substrate;
forming a hard mask layer on a surface of the sacrificial layer;
patterning the sacrificial layer and the hard mask layer;
removing part of the patterned sacrificial layer by wet etching with the patterned hard mask layer as a mask, to form a dummy gate electrode which has a top width bigger than a bottom width based on a difference between a first etching speed at the top and a second etching speed at the bottom using different densities in the single sacrificial layer at different distances from the substrate, and removing the patterned hard mask layer;
forming a dielectric layer covering the gate dielectric layer, an upper surface of the dielectric layer and an upper surface of the dummy gate electrode being on a substantially same level;
removing the dummy gate electrode to form a gate trench which has a top width bigger than a bottom width; and
filling the gate trench with gate material to form a gate electrode.

2. The method for forming a gate electrode of claim 1, wherein the sacrificial layer is a tungsten nitride layer, a density of nitrogen in the tungsten nitride layer decreasing with increasing distance from the substrate; and
the dummy gate electrode is a tungsten nitride dummy gate electrode.

3. The method for forming a gate electrode of claim 2, wherein a sidewall of the tungsten nitride dummy gate electrode and a bottom of the tungsten nitride dummy gate electrode form an angle of 91°-105°.

4. The method for forming a gate electrode of claim 2, wherein the tungsten nitride layer is formed on the gate dielectric layer by chemical vapor deposition; and
the chemical vapor deposition uses gases including $WF_6$, $H_2$, and $N_2$, a flow of $N_2$ in a reaction initial stage being bigger than a flow of $N_2$ in a reaction end stage.

5. The method for forming a gate electrode of claim 4, wherein a flow of $WF_6$ is 3-10 sccm, a flow of $N_2$ is 50-200 sccm and a flow of $H_2$ is 100-1000 sccm.

6. The method for forming a gate electrode of claim 5, wherein the flow of $N_2$ gradually decreases.

7. The method for forming a gate electrode of claim 4, wherein a reaction time of the chemical vapor deposition is 5-15 seconds.

8. The method for forming a gate electrode of claim 2, wherein the wet etching is performed with $H_2SO_4$ solution, $NH_4OH$ solution, or HF solution.

9. The method for forming a gate electrode of claim 2, wherein the tungsten nitride dummy gate electrode is removed by dry etching.

10. The method for forming a gate electrode of claim 9, wherein the dry etching is performed with gases including $Cl_2$, HBr, and $SF_6$.

11. The method for forming a gate electrode of claim 1, wherein the gate dielectric layer includes a silicon dioxide layer, a silicon oxynitride layer, or a silicon nitride layer, or any combination thereof.

12. The method for forming a gate electrode of claim 11, wherein the gate dielectric layer further includes at least one high-k dielectric layer with a k higher than 4.5.

13. The method for forming a gate electrode of claim 2, further comprising: forming a spacer surrounding the tungsten nitride dummy gate electrode after removing the patterned hard mask layer and before forming the dielectric layer.

* * * * *